United States Patent
Butterworth

(10) Patent No.: US 9,755,122 B2
(45) Date of Patent: Sep. 5, 2017

(54) SUBSTRATE FOR LED WITH TOTAL-INTERNAL REFLECTION LAYER SURROUNDING LED

(71) Applicant: KONINKLIJKE PHILIPS N.V., Eindhoven (NL)

(72) Inventor: Mark Melvin Butterworth, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/032,021

(22) PCT Filed: Oct. 22, 2014

(86) PCT No.: PCT/IB2014/065525
§ 371 (c)(1),
(2) Date: Apr. 25, 2016

(87) PCT Pub. No.: WO2015/068072
PCT Pub. Date: May 14, 2015

(65) Prior Publication Data
US 2016/0260872 A1 Sep. 8, 2016

Related U.S. Application Data

(60) Provisional application No. 61/901,072, filed on Nov. 7, 2013, provisional application No. 61/935,360, filed on Feb. 4, 2014.

(51) Int. Cl.
*H01L 33/54* (2010.01)
*H01L 33/56* (2010.01)
(Continued)

(52) U.S. Cl.
CPC .............. *H01L 33/56* (2013.01); *H01L 33/54* (2013.01); *H01L 33/60* (2013.01); *H01L 33/62* (2013.01);
(Continued)

(58) Field of Classification Search
CPC ........................................................ H01L 35/56
See application file for complete search history.

(56) References Cited

U.S. PATENT DOCUMENTS

2006/0261360 A1   11/2006   Takehashi et al.
2009/0103298 A1   4/2009    Boonekamp et al.
(Continued)

FOREIGN PATENT DOCUMENTS

DE   102009033287 A1   1/2011
EP   1193773 A2        4/2002
(Continued)

OTHER PUBLICATIONS

EPO as ISA, "International Search Report and Written Opinion" dated Feb. 11, 2015 from International Application No. PCT/IB2014/065525, filed Oct. 22, 2014, 9 pages.

*Primary Examiner* — Fernando L Toledo
*Assistant Examiner* — Valerie N Newtown
(74) *Attorney, Agent, or Firm* — Brian D. Ogonowsky; Patent Law Group LLP

(57) ABSTRACT

A packaged LED module includes an LED die mounted on a substrate surface. Formed on the substrate surface and surrounding the die is a first layer of a low index of refraction material. A lens of a higher index of refraction material is molded over the LED die and the first layer. The interface of the lens and the first layer reflects light by total internal reflection (TIR), in accordance with Snell's Law, when the LED light impinges at greater than the critical angle. The first layer may be a low index epoxy, silicone, or (Continued)

other material. In another embodiment, a layer surrounding the LED die is processed after the lens is formed to create an air/lens interface for TIR. The LED die may include a phosphor layer, which results in even more side light being reflected off the interface and not absorbed by the substrate surface.

11 Claims, 2 Drawing Sheets

(51) Int. Cl.
　　*H01L 33/60*　　　(2010.01)
　　*H01L 33/62*　　　(2010.01)
　　*H01L 33/50*　　　(2010.01)
(52) U.S. Cl.
　　CPC .... *H01L 33/50* (2013.01); *H01L 2224/16225* (2013.01); *H01L 2933/0058* (2013.01)

(56) References Cited

U.S. PATENT DOCUMENTS

| | | |
|---|---|---|
| 2009/0213591 A1 | 8/2009 | Katabe et al. |
| 2010/0006877 A1 | 1/2010 | Chen |
| 2011/0001148 A1 | 1/2011 | Sun et al. |
| 2011/0062470 A1 | 3/2011 | Bierhuizen et al. |

FOREIGN PATENT DOCUMENTS

| | | |
|---|---|---|
| WO | 2008087572 A1 | 7/2008 |
| WO | 2012141094 A1 | 10/2012 |

SUBSTRATE FOR LED WITH TOTAL-INTERNAL REFLECTION LAYER SURROUNDING LED

CROSS-REFERENCE TO RELATED APPLICATIONS

The present application is a §371 application of International Application No. PCT/IB2014/065525 filed on Oct. 22, 2014 and entitled "SUBSTRATE FOR LED WITH TOTAL-INTERNAL REFLECTION LAYER SURROUNDING LED," which claims the benefit of U.S. Provisional Application Ser. Nos. 61/901,072, filed Nov. 7, 2013 and 61/935,360 filed Feb. 4, 2014. PCT/IB2014/065525, U.S. Ser. Nos. 61/901,072, and 61/935,360 are incorporated herein by reference.

FIELD OF THE INVENTION

This invention relates to light emitting diodes (LEDs) mounted on a substrate and, in particular, to a technique of improving the reflectivity of the substrate surrounding the LED to improve light extraction efficiency.

BACKGROUND

FIG. 1 illustrates a conventional flip chip LED die 10 mounted on a submount 12. In a flip-chip, both the n and p electrodes are formed on the bottom of the LED die.

The LED die 10 is formed of semiconductor epitaxial layers, including an n-layer 14, an active layer 15, and a p-layer 16, grown on a growth substrate, such as a sapphire substrate. The growth substrate has been removed in FIG. 1 by laser lift-off, etching, grinding, or by other techniques. In one example, the epitaxial layers are GaN based, and the active layer 15 emits blue light.

A pre-fabricated phosphor tile 17 is affixed over the top surface of the LED die 10 by silicone or other transparent adhesive (not shown). For white light, the tile 17 may be formed of a YAG phosphor, which emits yellow light. Some of the blue LED light leaks through the tile 17 and combines with the yellow light. A red phosphor layer may be added to create a warmer white light.

A metal electrode 18 electrically contacts the p-layer 16, and a metal electrode 20 electrically contacts the n-layer 14. In one example, the electrodes 18 and 20 are gold pads that are ultrasonically welded to anode and cathode metal pads 22 and 23 on a ceramic submount 12. The submount 12 has conductive vias 24 leading to bottom metal pads 26 and 28 for bonding to a printed circuit board.

U.S. Pat. No. 8,536,608, assigned to the present assignee and incorporated herein by reference, describes the use of a reflective ring 29 (e.g., R>90%) affixed to the surface of the submount 12 and surrounding the LED die 10. The ring 29 is formed of a reflective material, such as a sputtered Al or Ag layer. The ring 29 reflects light generated downward by the phosphor tile 17 and the active layer 15 (e.g., light rays 32 and 33). Submounts are typically ceramic, silicon, or other light absorbing material, so the ring 29 reduces the absorption of light by the package to increase efficiency.

The LED die 10, phosphor tile 17, and ring 29 are then encapsulated by a molded, transparent hemispherical lens 34, such as formed of silicone, to protect the LED die 10 and increase light extraction efficiency. The index of refraction of the lens 34 (e.g., n=1.5) is typically between the index of air and the index of the various LED layers.

Although the reflectivity of the ring 29 is relatively high, it is not 100%. Therefore, there is still some light absorption by the ring 29. Further, the outer edge of the ring 29 material must end prior to the edge of the lens 34 in order to ensure a good hermetic seal between the lens 34 and the submount surface. Therefore, there is some light scattering and absorption between the edge of the ring 29 and the edge of the lens 34. Further, forming a metal ring is relatively complex and adds cost to the package.

What is needed is a technique to reflect even more downward light from the LED die and the phosphor tile.

SUMMARY

Instead of a ring formed of a reflecting material surrounding an LED die mounted on a substrate, a dielectric ring using total internal reflection (TIR) is used. With TIR, there is 100% reflection.

In one embodiment, a smooth, thin layer of a dielectric material is formed on the substrate surface and around the LED die. The material has an index of refraction (e.g., n<1.4) lower than the index of the encapsulating lens material (e.g., n=1.5). The material has very good adhesion to the substrate surface and to the lens material. The material may be moisture proof and extend beyond the edge of the lens.

Any phosphor or LED light impinging on the interface of the lens and the low-index material at greater than the critical angle reflects off the interface with substantially 100% reflectance. The low-index material is simpler to deposit than a reflective metal. Since the low-index material may extend beyond the edge of the lens, there is no scattering of light at any edges, and the maximum amount of light is reflected. Further, since the material is a dielectric, there is no concern about shorting out electrodes due to misalignment.

If the low-index material is itself also reflective, such as a diffusing white layer, any light impinging at less than the critical angle is reflected by other than TIR and not absorbed by the substrate. Such a white layer may be a low index epoxy containing $TiO_2$ particles.

In another embodiment, a sealed air layer (n=1) is formed over the substrate surface around the LED die to achieve the maximum TIR and lowest critical angle. The air layer may be formed by molding the substrate to have an indentation around the LED die area. Prior to molding the lens, the indentation is filled with a material that initially blocks the lens material from filling in the indentation. After the lens is formed, the material is evaporated, dissolved, or shrunk to create an air gap. The air/lens interface forms an excellent TIR interface.

In another embodiment, the air gap is formed by a porous dielectric material that is mostly air.

In another embodiment, a hydrophilic-type material is deposited around the LED die, such as in an indented ring (a moat), whereby the molded lens material does not adhere to the hydrophilic-type material but adheres to the substrate surface around it. After the lens is formed, the hydrophilic-type material is then cured with heat or UV light and shrinks away from the lens. This results in a very thin air gap between the remaining hydrophilic-type material and the lens to create a TIR interface. One suitable hydrophilic-type material is an oil.

The present invention applies to packaging any type of LED die, including flip-chip LEDs (both electrodes on the bottom), vertical LEDs (one electrode on the top and one electrode on the bottom), and lateral LEDs (both electrodes on top). The invention also applies to phosphor-converted LEDs (pc-LEDs) and non-pc-LEDs. For pc-LEDs, the phosphor may be affixed to the top of the LED die as a tile or cover the top and side surfaces of the LED die. With a pc-LED, there is more side light and thus more efficiency gain by using the present invention.

The substrate may be a submount that is used as an interposer between an LED die and a printed circuit board.

BRIEF DESCRIPTION OF THE DRAWINGS

Elements in the various figures that are the same or similar are labeled with the same numeral.

DETAILED DESCRIPTION

Figure 1:
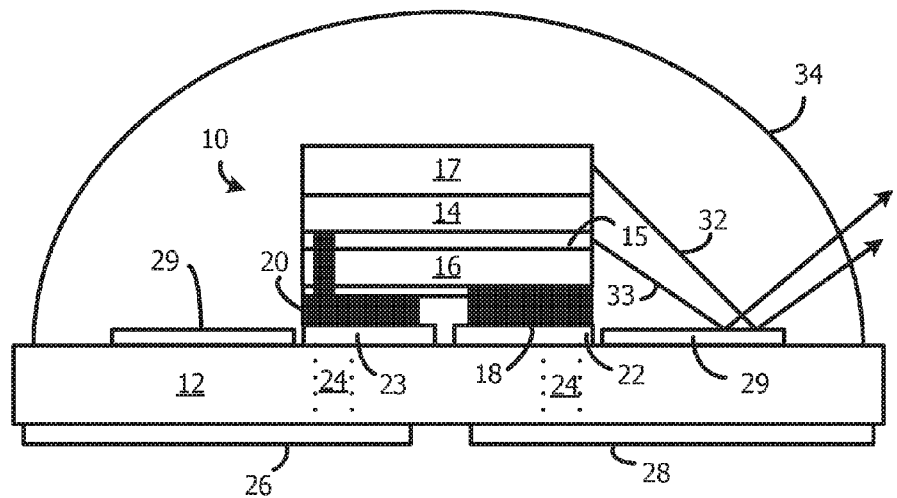
FIG. 1 is a cross-sectional view of a prior art packaged LED die with a metal reflective ring around the die formed over the substrate surface.
Figure 2:
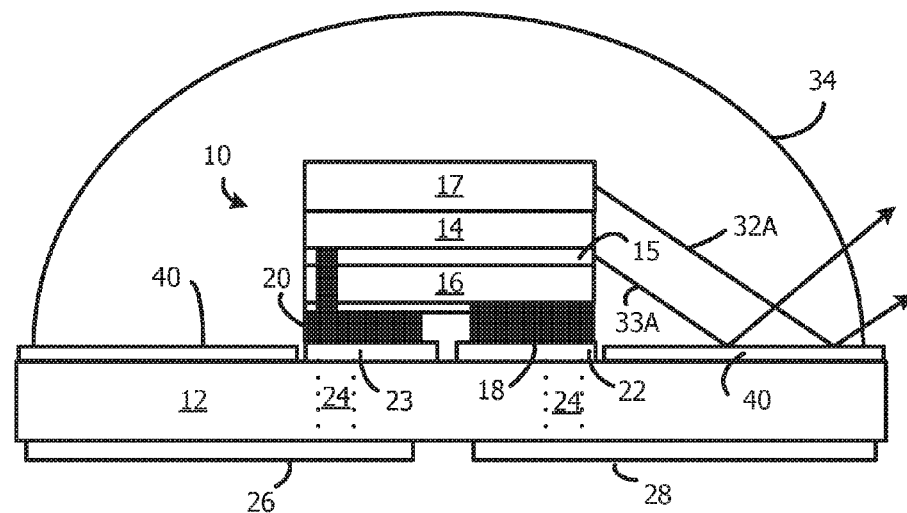
FIG. 2 illustrates the LED die of FIG. 1 surrounded by a low index of refraction layer, where the layer/lens interface reflects using TIR, in accordance with one embodiment of the invention.

FIG. 2 illustrates a packaged LED module, similar to that of FIG. 1, except that the metal reflective ring is replaced by a dielectric layer 40 having an index of refraction lower than that of the silicone lens 34. Assuming the lens 34 has an index of 1.5-1.6, the layer 40 has an index preferably less than 1.4; however, any index less that of the lens material would create TIR at the interface. The index differential determines the critical angle. In a preferred embodiment, the difference in indices is at least 0.4. The layer 40 may be formed of an epoxy, silicone, or other suitable material. Such epoxies and silicones are commercially available with selectable indices of refraction down to 1.38. For example, a methyl-based silicone has an index of 1.4. Since such materials are moisture proof and adhere well to the lens material and substrate surface, the layer 40 may be deposited over the entire surface of the substrate 12 around the LED die 10, and the lens 34 may be molded directly over the layer 40. Thus, there are no edge effects, and there is a maximum reflective area.

The layer 40 may be deposited on the substrate 12 prior to attachment of the LED 10 die using a mask over the LED die area. Alternately, a "lift-off" layer may be deposited over the LED die 10, followed by a blanket deposition of the layer 40. The lift-off material is then dissolved, and the layer 40 portion over the LED die 10 is lifted off.

The layer 40 can be any thickness since only the interface between the layer 40 and the lens 34 is relevant for the TIR. For example, the layer 40 may be less than 3 microns. The interface should be as smooth as possible for maximum TIR.

FIG. 2 illustrates the light rays 32A and 33A reflecting off the interface using TIR with no absorption. Since a vast majority of the downward light from the phosphor tile 17 and the active layer 15 is at a shallow angle with respect to the layer 40, almost all the impinging light will be impinge at greater than the critical angle and be reflected by TIR in accordance with Snell's Law. The substrate's metal pads 22 and 23 may be reflective (e.g., Al or Ag) and extend out from under the LED die 10 to reflect light at less than the critical angle. The layer 40 may be formed over any portion of the pads 22 and 23 that extend out from under the LED 10.

The LED 10 is shown much thicker and wider relative to the remaining structure than in an actual device, so the light rays will be much shallower in an actual device. In an actual device, the LED die 10 may only have a height of less than 10 microns, and its width may be less than 0.5 mm. The hemispherical lens 34 may have a diameter of about 5 mm.

The use of phosphor is not required for the layer 40 to achieve its purpose of increasing the amount of light reflected out of the package. The thicker the phosphor tile 17 (or other type of phosphor layer), the more side light will be generated and reflected by the layer 40.

The LED die 10 is shown as a flip-chip, but the LED die may instead be a vertical or lateral LED, with one or more wire bonds being connected to metal pads on the substrate. The wires are encapsulated by the lens 34. If there are metal pads (e.g., wire bond pads) that extend beyond the footprint of the LED die, the layer 40 may be deposited over those pads after wire bonding has taken place.

In another embodiment, the layer 40 may even be formed over the reflective metal ring 29 shown in FIG. 1, so that any light at less than the critical angle that passes through the layer 40 will be reflected by the ring 29.

Figure 3:
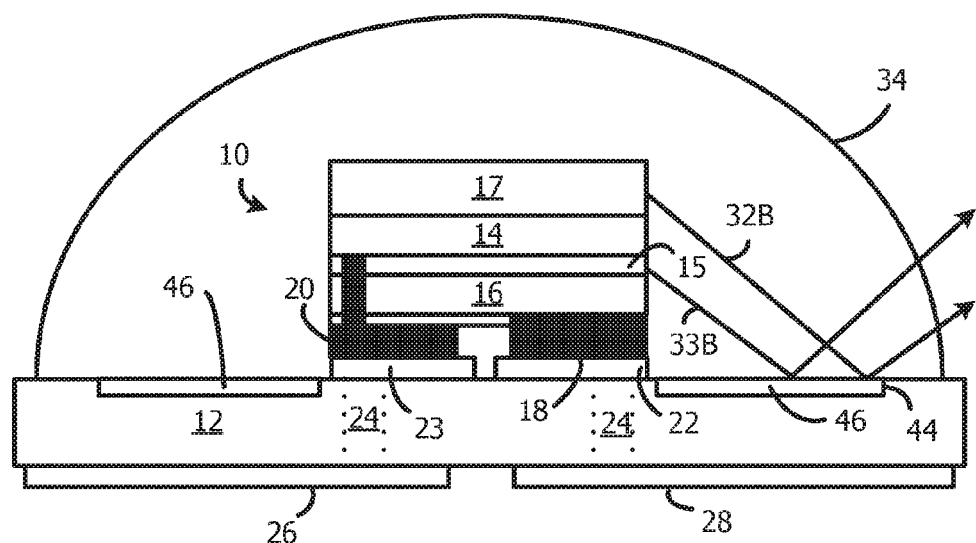
FIG. 3 illustrates the LED die of FIG. 1 surrounded by a thin layer of air in a moat formed in the substrate surface, where the air/lens interface reflects using TIR, in accordance with another embodiment of the invention.
Figure 4:
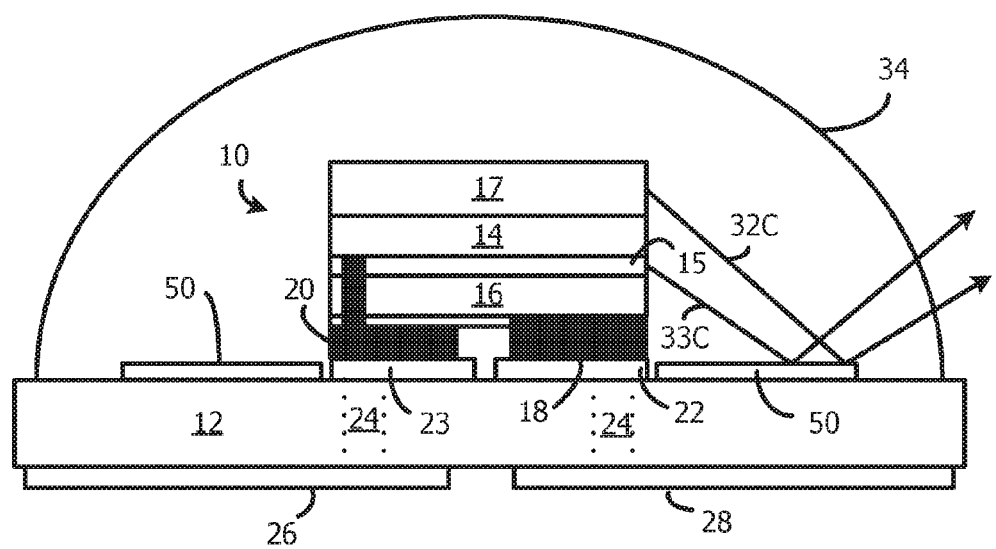
FIG. 4 illustrates the LED die of FIG. 1 surrounded by a thin layer of air created using a hydrophilic-type material separated from the lens, where the air/lens interface reflects using TIR, in accordance with another embodiment of the invention.

FIGS. 3 and 4 illustrate a packaged LED module where the low index layer surrounding the LED die 10 is air.

In FIG. 3, the substrate 12 is molded to include a circular moat 44 (an indentation) around the LED die 10 that ends before the lens 34 edge. The moat 44 is filled with a material that has a flat upper surface when the lens 34 is molded over it to provide a smooth interface surface. The material is of a type that evaporates, dissolves, shrinks from the lens material, or becomes porous after curing. Laser ablation may also be used for evaporating the material. After the lens 34 is molded over the substrate 12, the material in the moat 44 is cured. If the material is evaporated, dissolves, shrinks away from the lens 34, or is porous, the moat 44 will be primarily filled with air 46 or another low index gas. The air/lens interface will then have the maximum differential in indices to provide TIR over a wide range of light angles. By using the moat 44, a precise amount of the material can be provided having a flat surface. Light rays 32B and 33B are shown reflecting off the air/lens interface.

In one embodiment, the moat 44 is filled with sol-gel. Sol-gel is well known and comprises nano-particles in a solvent to form a gel. After the lens 34 is formed, the solvent is then dried by heat, resulting in some shrinkage and crystals formed by the nano-particles. The resulting layer will create an air gap below the lens 34.

The air gap may also be created over the reflective metal ring 29 of FIG. 1 so that any light rays penetrating the air gap will be reflected by the ring 29.

FIG. 4 is similar to FIG. 3 but the air gap is formed by depositing a hydrophilic-type material, such as an oil, in the area with the air gap is to be formed. Such hydrophilic-type materials are known which prevent adhesion of silicone or other lens material to it. After the lens 34 is formed, the lens 34 adheres to the substrate 12 surface but does not adhere to the hydrophilic-type material. The hydrophilic-type material is then heated or otherwise cured to shrink it, leaving the air gap 50 shown in FIG. 4. In another embodiment, the hydrophilic-type material may fill the moat 44 in FIG. 3 and, when it is shrunk during curing, the hydrophilic-type material pulls away from the lens 34, creating the air gap. Light rays 32C and 33C are shown reflecting off the air/lens interface.

If the processing is performed on a substrate wafer supporting many LED dies, the substrate 12 is then singulated to form individual LEDs/substrates, where the various figures can represent the individual LEDs/substrates.

Although the substrate 12 in the examples is a submount interposer between the LED die and a printed circuit board (PCB), any substrate may be used, such as a (PCB).

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
    a light emitting diode (LED) die mounted on a substrate surface;
    a lens of a first material encapsulating the LED die and extending over the substrate surface, the first material having a first index of refraction, wherein the first material comprises silicone molded over the substrate surface;
    a first layer of a second material over the substrate surface surrounding the LED die, the second material and the first material meeting at an interface surrounding the LED die, the second material having a second index of refraction lower than the first index of refraction, wherein the second material comprises a gas layer; and
    a shrinkable second layer formed on the substrate that has pulled back from the lens to create a gap containing the second material.

2. The device of claim 1 wherein the silicone has an index of refraction greater than 1.5.

3. The device of claim 1 wherein the first layer of the second material extends under an outer edge of the lens.

4. The device of claim 1 wherein a periphery of the first layer of the second material is within the lens.

5. The device of claim 1 wherein the gas comprises air.

6. The device of claim 1 wherein a difference between the first index of refraction and the second index of refraction is at least 0.4.

7. The device of claim 1 wherein the substrate surface is a submount surface.

8. The device of claim 1 wherein the LED die comprises a phosphor layer, such that at least a portion of the light emitted from the phosphor layer reflects off the interface by total internal reflection (TIR).

9. The device of claim 1 wherein the substrate surface has an indentation surrounding the LED die, wherein at least part of the indentation contains the second material.

10. A light emitting device comprising:
    a light emitting diode (LED) die mounted on a substrate surface;
    a lens of a first material encapsulating the LED die and extending over the substrate surface, the first material having a first index of refraction, wherein the first material comprises silicone molded over the substrate surface;
    a first layer of a second material over the substrate surface surrounding the LED die, the second material and the first material meeting at an interface surrounding the LED die, the second material having a second index of refraction lower than the first index of refraction, wherein the second material comprises a gas layer; and
    a porous layer formed on the substrate surface, the porous layer comprising the second material.

11. A method of forming a light emitting device comprising:
    providing a light emitting diode (LED) die mounted on a substrate surface;
    forming a first layer of a first material on the substrate surface;
    forming a lens of a second material over the LED die and over the first layer, the second material having an index of refraction; and
    processing the first layer after the lens is formed to cause a gap containing a gas between the substrate surface and the second material, wherein an interface is created where the gas contacts the second material, wherein an index of refraction of the gas is lower than the index of refraction of the second material.

\* \* \* \* \*